US012785701B2

(12) United States Patent

Ikeda et al.

(10) Patent No.: US 12,785,701 B2
(45) Date of Patent: Nov. 3, 2026

(54) PHASE COMPARATOR AND PLL CIRCUIT

(71) Applicant: Mitsubishi Electric Corporation, Tokyo (JP)

(72) Inventors: Sho Ikeda, Tokyo (JP); Koji Tsutsumi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 50 days.

(21) Appl. No.: 18/929,914

(22) Filed: Oct. 29, 2024

(65) Prior Publication Data

US 2025/0055465 A1 Feb. 13, 2025

Related U.S. Application Data

(63) Continuation of application No. PCT/JP2022/022573, filed on Jun. 3, 2022.

(51) Int. Cl.
*H03L 7/08* (2006.01)
*H03L 7/089* (2006.01)

(52) U.S. Cl.
CPC .................................. *H03L 7/0895* (2013.01)

(58) Field of Classification Search
CPC .................... H03L 7/0895; H03K 2217/96072
USPC ........................................................ 327/1–12
See application file for complete search history.

(56) References Cited

U.S. PATENT DOCUMENTS

2004/0051592 A1* 3/2004 Ho ........................ H03L 7/0891 331/17
2006/0119405 A1* 6/2006 Kobayashi .............. H03L 7/081 327/158

FOREIGN PATENT DOCUMENTS

JP 2010-21781 A 1/2010

OTHER PUBLICATIONS

International Search Report (PCT/ISA/210) issued in PCT/JP2022/022573, dated Aug. 23, 2022.

* cited by examiner

*Primary Examiner* — Daniel C Puentes
(74) *Attorney, Agent, or Firm* — Birch, Stewart, Kolasch & Birch, LLP

(57) ABSTRACT

A phase comparator functions to compare phases of a reference clock signal and a feedback clock signal, and output a voltage rising and a voltage falling signals based on a phase difference, to output a rising reset and a falling reset signals having a pulse width of the voltage rising and the voltage falling signals when the phase difference is zero every time the phase frequency comparator outputs the voltage rising and the voltage falling signals, to output a first current based on the voltage rising and the voltage falling signals, and output a second current based on the rising reset and the falling reset signals, and having a capacitor charged with the first current and the second current, to output a current based on a difference between the charges by the first current and the second current.

8 Claims, 11 Drawing Sheets

Reset Mode

Mode 1

Mode 2

Mode 3

PHASE COMPARATOR AND PLL CIRCUIT

CROSS REFERENCE TO RELATED APPLICATION

This application is a Continuation of PCT International Application No. PCT/JP2022/022573, filed on Jun. 3, 2022, which is hereby expressly incorporated by reference into the present application.

TECHNICAL FIELD

The present disclosure relates to a phase comparator and a PLL circuit.

BACKGROUND ART

A phase locked loop (PLL) circuit is a circuit that compares a phase of a reference signal output from a reference signal source with a phase of a divided frequency signal (feedback signal) output from a variable frequency divider to be described later, and applies negative feedback in such a manner that a difference therebetween becomes zero, thereby outputting a signal having a stable frequency. In particular, an analog PLL using a phase frequency comparator (phase frequency detector, hereinafter also referred to as "PFD") and a charge pump (hereinafter also referred to as "CP") is widely used because it has a wide acquisition range and high stability.

Further, the analog PLL includes a loop filter that generates and outputs a voltage on the basis of a current output from the CP, a voltage-controlled oscillator that generates and outputs an output clock signal having a frequency corresponding to the voltage output from the loop filter, and a variable frequency divider that frequency-divides the output clock signal of the voltage-controlled oscillator and outputs a frequency-divided output clock signal to the PFD as a frequency-divided signal (feedback signal).

In the analog PLL, the PFD generates a pulse signal based on a result of comparison between the phase of the reference signal with a phase of the feedback signal, and outputs the generated pulse signal to the CP. Thus, the PFD controls on/off of the current output from the CP. However, when a pulse width of the pulse signal is too narrow, the switch in the CP cannot react, and nonlinearity of a phase comparison characteristic is generated. Accordingly, the PFD is designed to generate and output a pulse signal (reset pulse signal) having a certain pulse width even when a detected phase difference is zero.

On the other hand, the CP may have a parasitic capacitor therein. In that case, in the CP, the parasitic capacitor is charged and discharged in accordance with the reset pulse signal, and due to this charge and discharge, a noise current may be output for a time corresponding to the pulse width of the reset pulse signal. In that case, phase noise may be degraded in the PLL circuit. In particular, in the CMOS process, low frequency noise due to flicker noise is large, and deterioration of phase noise in a low offset frequency region due to this is a problem. In order to solve this problem, for example, in Patent Literature 1, the output current of the CP is accumulated and discharged over a plurality of periods to average noise and suppress phase noise in the low offset frequency region.

CITATION LIST

Patent Literature

Patent Literature 1: JP 2010-21781 A

SUMMARY OF INVENTION

Technical Problem

However, in the method described in Patent Literature 1 (hereinafter, also referred to as a "conventional method"), in order to obtain a higher noise suppression effect, it is necessary to lengthen a period for averaging noise. In that case, the conventional method has a problem that loop stability is deteriorated.

An object of the present disclosure is to provide a phase comparator capable of suppressing phase noise in a low offset frequency region without impairing loop stability as compared with the conventional method.

Solution to Problem

A phase comparator according to the present disclosure includes a phase frequency comparator to compare phases of a reference clock signal and a feedback clock signal, and output a voltage rising signal and a voltage falling signal on the basis of a difference of the phases, a reset pulse simulation circuit to output a rising reset signal and a falling reset signal having a pulse width corresponding to pulse widths of the voltage rising signal and the voltage falling signal output from the phase frequency comparator when a phase difference between the reference clock signal and the feedback clock signal is zero every time the phase frequency comparator completes outputting of the voltage rising signal and the voltage falling signal, a charge pump circuit to output a first current on the basis of the voltage rising signal and the voltage falling signal output from the phase frequency comparator, and output a second current on the basis of the rising reset signal and the falling reset signal output from the reset pulse simulation circuit, and a current output circuit having a capacitor capable of being charged with a charge in accordance with the first current output from the charge pump circuit and a charge in accordance with the second current output from the charge pump circuit, the current output circuit being to output a current based on a difference between the charge in accordance with the first current and the charge in accordance with the second current that are charged in the capacitor.

Advantageous Effects of Invention

According to the present disclosure, with the above-described configuration, it is possible to suppress phase noise in a low offset frequency region without impairing loop stability as compared with the conventional method.

BRIEF DESCRIPTION OF DRAWINGS

FIGS. 11A to 11D are diagrams illustrating an operation example of a second switched capacitor circuit in the third embodiment, in which FIG. 11A is a diagram illustrating an operation example in a reset mode, FIG. 11B is a diagram illustrating an operation example in mode 1, FIG. 11C is a diagram illustrating an operation example in mode 2, and FIG. 11D is a diagram illustrating an operation example in mode 3.

DESCRIPTION OF EMBODIMENTS

Hereinafter, embodiments will be described in detail with reference to the drawings.

First Embodiment

Figure 1:
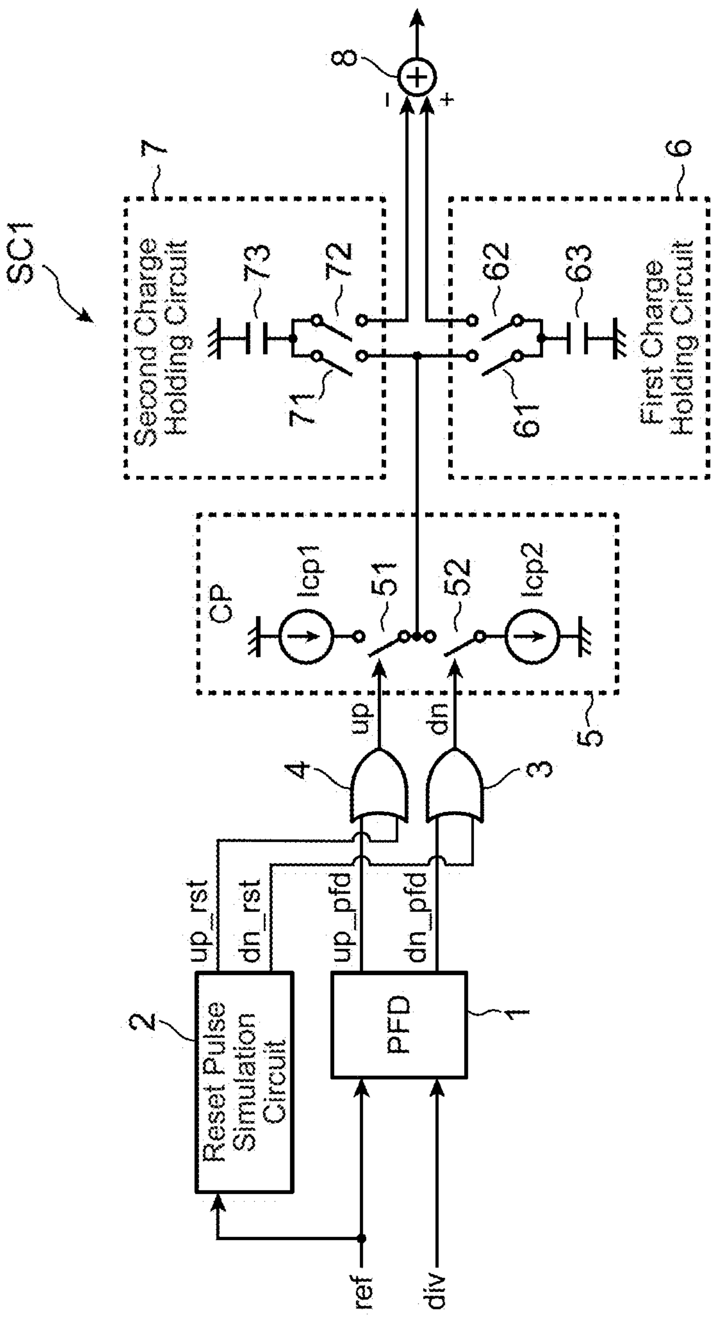
FIG. 1 is a diagram illustrating a configuration example of a phase comparator included in a PLL circuit according to a first embodiment.

FIG. 1 is a diagram illustrating a configuration example of a phase comparator included in a PLL circuit according to a first embodiment. As illustrated in FIG. 1, the phase comparator according to the first embodiment includes a phase frequency detector (PFD) 1, a reset pulse simulation circuit 2, an OR circuit 3, an OR circuit 4, a charge pump circuit (CP) 5, a first charge holding circuit 6, a second charge holding circuit 7, and a subtraction circuit 8 are included. Among them, the first charge holding circuit 6 and the second charge holding circuit 7 constitute a first switched capacitor circuit SC1. Further, the first switched capacitor circuit SC1 and the subtraction circuit 8 constitute a current output circuit.

The PFD 1 includes two input terminals and two output terminals. A reference clock signal ref output from a reference signal source (not illustrated) is input to a first input terminal of the PFD 1. A feedback clock signal div output from a variable frequency divider (not illustrated) included in the PLL circuit and fed back to the PFD 1 is input to a second input terminal of the PFD 1.

The PFD 1 compares a phase of the reference clock signal ref with a phase of the feedback clock signal div, and outputs a signal for controlling the charge pump circuit 5 depending on a phase difference. Specifically, the PFD 1 outputs a voltage rising signal up_pfd and a voltage falling signal dn_pfd from a first output terminal and a second output terminal, respectively, depending on a phase difference between the phase of the reference clock signal ref and the phase of the feedback clock signal div.

The reset pulse simulation circuit 2 includes one input terminal and two output terminals. The input terminal of the reset pulse simulation circuit 2 is connected to the first input terminal of the PFD 1, and the reference clock signal ref is input to the input terminal of the reset pulse simulation circuit 2.

The reset pulse simulation circuit 2 outputs a rising reset signal up_rst and a falling reset signal dn_rst as reset pulse signals from a first output terminal and a second output terminal, respectively, every time the PFD 1 completes outputting of the voltage rising signal up_pfd and the voltage falling signal dn_pfd.

The rising reset signal up_rst and the falling reset signal dn_rst are signals having a pulse width corresponding to a pulse width τpul of the voltage rising signal up_pfd and the voltage falling signal dn_pfd output from the PFD 1 when the phase difference between the reference clock signal ref and the feedback clock signal div is zero. Note that the "pulse width corresponding to the pulse width τpul" includes a concept of the same pulse width as the pulse width τpul or substantially the same pulse width as the pulse width τpul.

Note that the pulse width τpul is designed in such a manner that the PFD 1 generates and outputs a signal having a certain pulse width even when the phase difference between the reference clock signal ref and the feedback clock signal div is zero in order to avoid that a switch in the CP 5 cannot react and nonlinearity of a phase comparison characteristic occurs when the pulse width of the pulse signal is too small as described above.

The reset pulse simulation circuit 2 outputs the rising reset signal up_rst and the falling reset signal dn_rst having a pulse width corresponding to the pulse width τpul every time the PFD 1 completes outputting of the voltage rising signal up_pfd and the voltage falling signal dn_pfd. For example, the reset pulse simulation circuit 2 outputs the rising reset signal up_rst and the falling reset signal dn_rst in synchronization with a falling edge of the reference clock signal ref.

The OR circuit 3 includes two input terminals and one output terminal. A first input terminal of the OR circuit 3 is connected to the second output terminal of the PFD 1, and a second input terminal is connected to the second output terminal of the reset pulse simulation circuit 2.

When the voltage falling signal dn_pfd is input from the PFD 1, the OR circuit 3 outputs the voltage falling signal dn_pfd as a signal dn from the output terminal. Further, when the falling reset signal dn_rst is input from the reset pulse simulation circuit 2, the OR circuit 3 outputs the falling reset signal dn_rst as the signal dn from the output terminal.

The OR circuit 4 includes two input terminals and one output terminal. A first input terminal of the OR circuit 4 is connected to the first output terminal of the PFD 1, and a second input terminal is connected to the first output terminal of the reset pulse simulation circuit 2.

When the voltage rising signal up_pfd is input from the PFD 1, the OR circuit 4 outputs the voltage rising signal up_pfd as a signal up from the output terminal. Further, when the rising reset signal up_rst is input from the reset pulse simulation circuit 2, the OR circuit 4 outputs the rising reset signal up_rst as a signal up from the output terminal.

The CP 5 includes a first current source Icp1 that is a current source for current discharge, a second current source Icp2 that is a current source for current suction, a switch 51, a switch 52, and an output terminal.

Further, the switch 51 and the switch 52 of the CP 5 have parasitic capacitors (not illustrated). A charge is charged in the parasitic capacitor by the first current source Icp1 and the second current source Icp2 when the switch 51 and the switch 52 are turned on. Further, from this parasitic capacitor, the charge is discharged when the switch 51 and the switch 52 are turned off.

One end of the first current source Icp1 is connected to ground and the other end is connected to the switch 51. One end of the second current source Icp2 is connected to the ground and the other end is connected to the switch 52.

One end of the switch 51 is connected to the other end of the first current source Icp1, and the other end is connected to the output terminal. One end of the switch 52 is connected to the other end of the second current source Icp2, and the other end is connected to the output terminal.

The switch 51 is controlled to be turned on and off in response to the signal up output from the output terminal of the OR circuit 4. Thus, in the CP 5, the connection state between the first current source Icp1 and the output terminal is switched.

The switch 52 is controlled to be turned on and off in response to the signal dn output from the output terminal of the OR circuit 3. Thus, in the CP 5, the connection state between the second current source Icp2 and the output terminal is switched.

When the signal up output from the output terminal of the OR circuit 4 and the signal dn output from the output terminal of the OR circuit 3 are the voltage rising signal up_pfd and the voltage falling signal dn_pfd output from the PFD 1, the charge pump circuit 5 generates a first current by switching on/off of the switch 51 and the switch 52 on the basis of the signal up and the signal dn, and outputs the generated first current from the output terminal.

Here, the first current is a current obtained by combining a current (hereinafter, also referred to as a "charge pump current Icp") generated on the basis of a phase difference between the voltage rising signal up_pfd and the voltage falling signal dn_pfd, that is, a phase difference between the reference clock signal ref and the feedback clock signal div, and a noise current Inoise generated by charging and discharging with respect to the parasitic capacitor described above.

Further, when the signal up output from the output terminal of the OR circuit 4 and the signal dn output from the output terminal of the OR circuit 3 are the rising reset signal up_rst and the falling reset signal dn_rst output from the reset pulse simulation circuit 2, the charge pump circuit 5 generates a second current by switching on/off of the switch 51 and the switch 52 on the basis of the signal up and the signal dn, and outputs the generated second current from the output terminal.

Here, as described above, the rising reset signal up_rst and the falling reset signal dn_rst are signals having a pulse width corresponding to the pulse width τpul of the voltage rising signal up_pfd and the voltage falling signal dn_pfd output from the PFD 1 when the phase difference between the reference clock signal ref and the feedback clock signal div is zero.

Therefore, in the second current, the current (charge pump current Icp) generated on the basis of the phase difference between the voltage rising signal up_pfd and the voltage falling signal dn_pfd, that is, the phase difference between the reference clock signal ref and the feedback clock signal div is zero. Thus, the second current becomes the noise current Inoise generated by charging and discharging with respect to the parasitic capacitor described above.

The current output circuit has a capacitor capable of being charged with a charge in accordance with the first current output from the charge pump circuit 5 and a charge in accordance with the second current output from the charge pump circuit 5, and outputs a current based on a difference between the charge in accordance with the first current and the charge in accordance with the second current that are charged in the capacitor.

In the first embodiment, the current output circuit includes the first switched capacitor circuit SC1 (the first charge holding circuit 6 and the second charge holding circuit 7) and the subtraction circuit 8.

The first charge holding circuit 6 includes an input terminal, a switch 61, a switch 62, a capacitor (first capacitor) 63, and an output terminal.

The input terminal of the first charge holding circuit 6 is connected to the output terminal of the CP 5. An output terminal of the first charge holding circuit 6 is connected to an input terminal of the subtraction circuit 8.

One end of the capacitor 63 is connected to the ground and the other end is connected to one end of the switch 61 and one end of the switch 62. The capacitor 63 is, for example, a capacitor.

The one end of the switch 61 is connected to the other end of the capacitor 63, and the other end is connected to the input terminal. The switch 61 switches a connection state between the input terminal and the capacitor 63.

The one end of the switch 62 is connected to the other end of the capacitor 63, and the other end is connected to the output terminal. The switch 62 switches a connection state between the output terminal and the capacitor 63.

The second charge holding circuit 7 includes an input terminal, a switch 71, a switch 72, a capacitor (second capacitor) 73, and an output terminal.

The input terminal of the second charge holding circuit 7 is connected to the output terminal of the CP 5. An output terminal of the second charge holding circuit 7 is connected to the input terminal of the subtraction circuit 8.

One end of the capacitor 73 is connected to the ground and the other end is connected to one end of the switch 71 and one end of the switch 72. The capacitor 73 is, for example, a capacitor.

The one end of the switch 71 is connected to the other end of the capacitor 73, and the other end is connected to the input terminal. The switch 71 switches a connection state between the input terminal and the capacitor 73.

The one end of the switch 72 is connected to the other end of the capacitor 73, and the other end is connected to the output terminal. The switch 72 switches a connection state between the output terminal and the capacitor 73.

The first charge holding circuit 6 and the second charge holding circuit 7 constitute the first switched capacitor circuit SC1. The first switched capacitor circuit SC1 charges the capacitor 63 with the charge in accordance with the first current output from the charge pump circuit 5 and charges the capacitor 73 with the charge in accordance with the second current output from the charge pump circuit 5 by switching on and off of the switch 61, the switch 62, the switch 71, and the switch 72 described above.

The subtraction circuit 8 includes two input terminals and one output terminal. A first input terminal of the subtraction circuit 8 is connected to the output terminal of the first charge holding circuit 6, and a second input terminal is connected to the output terminal of the second charge holding circuit 7.

The subtraction circuit 8 calculates a difference between a charge amount of the charge charged in the capacitor 63 of the first charge holding circuit 6 and a charge amount of the charge charged in the capacitor 73 of the second charge holding circuit 7, and outputs a current based on the calculated difference.

Further, the PLL circuit according to the first embodiment includes the phase comparator configured as described above, and a loop filter, a voltage-controlled oscillator, and a variable frequency divider, all of which are not illustrated.

The loop filter generates and outputs a voltage based on the current output from the phase comparator. The voltage-controlled oscillator generates and outputs an output clock signal having a frequency based on the voltage output from the loop filter. The variable frequency divider frequency-divides the output clock signal output from the voltage-controlled oscillator, and outputs the frequency-divided output clock signal to the PFD 1 as a feedback clock signal. Since the loop filter, the voltage-controlled oscillator, and the variable frequency divider are the same as the conventional, loop filter, the voltage-controlled oscillator, and the variable frequency divider, a detailed description thereof will be omitted.

Next, an operation example of the phase comparator according to the first embodiment will be described with reference to FIGS. 2 to 7.

The phase comparator according to the first embodiment operates mainly in three modes of mode 1, mode 2, and mode 3. The outline of the operation of the phase comparator in each mode will be described below.

(Mode 1)

In mode 1, the PFD 1 compares the phase of the reference clock signal ref with the phase of the feedback clock signal div, and outputs the voltage rising signal up_pfd and the voltage falling signal dn_pfd depending on the phase difference. The OR circuit 3 and the OR circuit 4 output the voltage rising signal up_pfd and the voltage falling signal dn_pfd output from the PFD 1 to the CP 5 as a signal up and a signal dn. The CP 5 generates and outputs a first current (charge pump current Icp+noise current Inoise) by switching on/off of the switch 51 and the switch 52 in response to the signal up and the signal dn. The charge in accordance with the first current output from the CP 5 is held by the capacitor 63 of the first charge holding circuit 6.

(Mode 2)

In mode 2, the reset pulse simulation circuit 2 generates and outputs the rising reset signal up_rst and the falling reset signal dn_rst. The OR circuit 3 and the OR circuit 4 output the rising reset signal up_rst and the falling reset signal dn_rst output from the reset pulse simulation circuit 2 to the CP 5 as the signal up and the signal dn. The CP 5 generates and outputs a second current (noise current Inoise) by switching on/off of the switch 51 and the switch 52 in response to the signal up and the signal dn. The charge in accordance with the second current output from the CP 5 is held by the capacitor 73 of the second charge holding circuit 7.

(Mode 3)

In mode 3, the subtraction circuit 8 calculates a difference between the charge held in the capacitor 63 of the first charge holding circuit 6 and the charge held in the capacitor 73 of the second charge holding circuit 7, and outputs a current based on the difference.

The phase comparator according to the first embodiment operates with mode 1 to mode 3 as one period. When the operation as mode 3 is completed in a certain period, the phase comparator operates as mode 1 in the next period, and then operates as mode 2 and mode 3. Hereinafter, the phase comparator repeats the above-described periods (mode 1 to mode 3).

Next, an operation example of the phase comparator in each mode will be described in detail.

Figure 2:
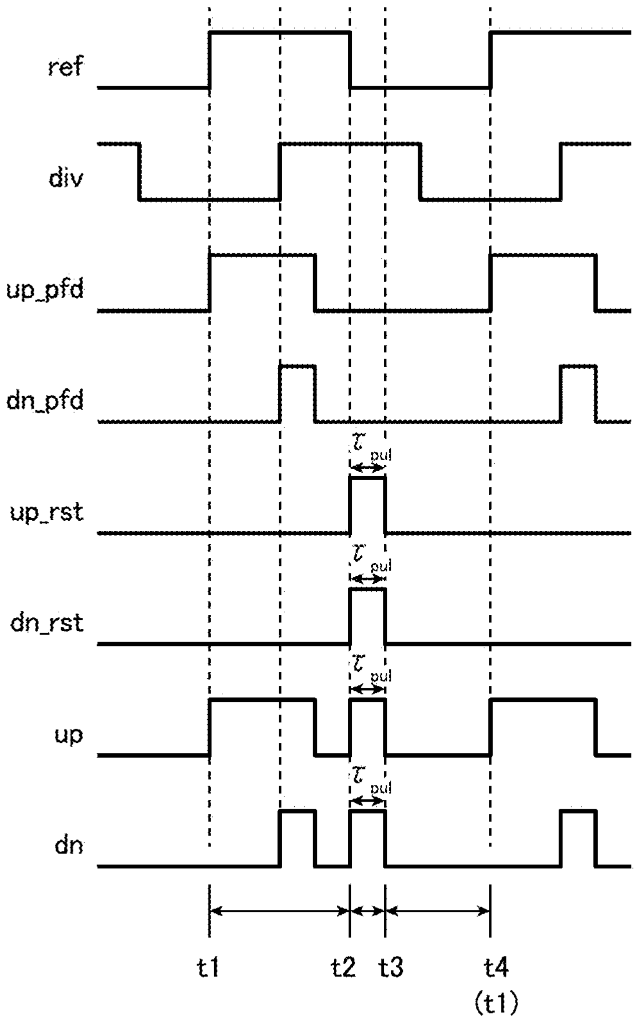
FIG. 2 is a diagram illustrating an example of waveform of signals (in a case where a phase of a reference clock signal is advanced from a phase of a feedback clock signal) in the first embodiment.

First, a case where the phase of the reference clock signal ref input to the PFD 1 is advanced from the phase of the feedback clock signal div will be described as an example. FIG. 2 is a diagram illustrating an example of waveforms of respective signals output from the PFD 1, the reset pulse simulation circuit 2, the OR circuit 3, and the OR circuit 4 in a case where the phase of the reference clock signal ref input to the PFD 1 is advanced from the phase of the feedback clock signal div. Note that, in FIG. 2, the horizontal axis represents time.

(Mode 1: Time t1 to t2)

The PFD 1 outputs the voltage rising signal up_pfd and the voltage falling signal dn_pfd depending on the phase difference between the reference clock signal ref and the feedback clock signal div. When the phase of the reference clock signal ref is advanced from the phase of the feedback clock signal div, the voltage falling signal dn_pfd output from the PFD 1 rises later than the voltage rising signal up_pfd as illustrated in FIG. 2.

The reset pulse simulation circuit 2 does not output the rising reset signal up_rst and the falling reset signal dn_rst in mode 1.

The OR circuit 3 outputs the signal dn_pfd output from the PFD 1 as the signal dn. The OR circuit 4 outputs the voltage rising signal up_pfd output from the PFD 1 as a signal up.

In the CP 5, the switch 51 is turned on in response to the signal up output from the OR circuit 4. Further, in the CP 5, the switch 52 is turned on behind the switch 51 in response to the signal dn output from the OR circuit 3.

In this case, the CP 5 outputs the charge pump current Icp for a time corresponding to the phase difference ΔΦ between the signal up and the signal dn, in other words, for a time corresponding to the phase difference ΔΦ between the reference clock signal ref and the feedback clock signal div. Further, the CP 5 outputs the noise current Inoise for a time obtained by adding a time corresponding to the pulse width τpul of the reset signal to a time corresponding to the phase difference ΔΦ between the signal up and the signal dn. As a result, in mode 1, the CP 5 outputs, as the first current, a current obtained by adding the noise current Inoise to the charge pump current Icp.

Figure 3:
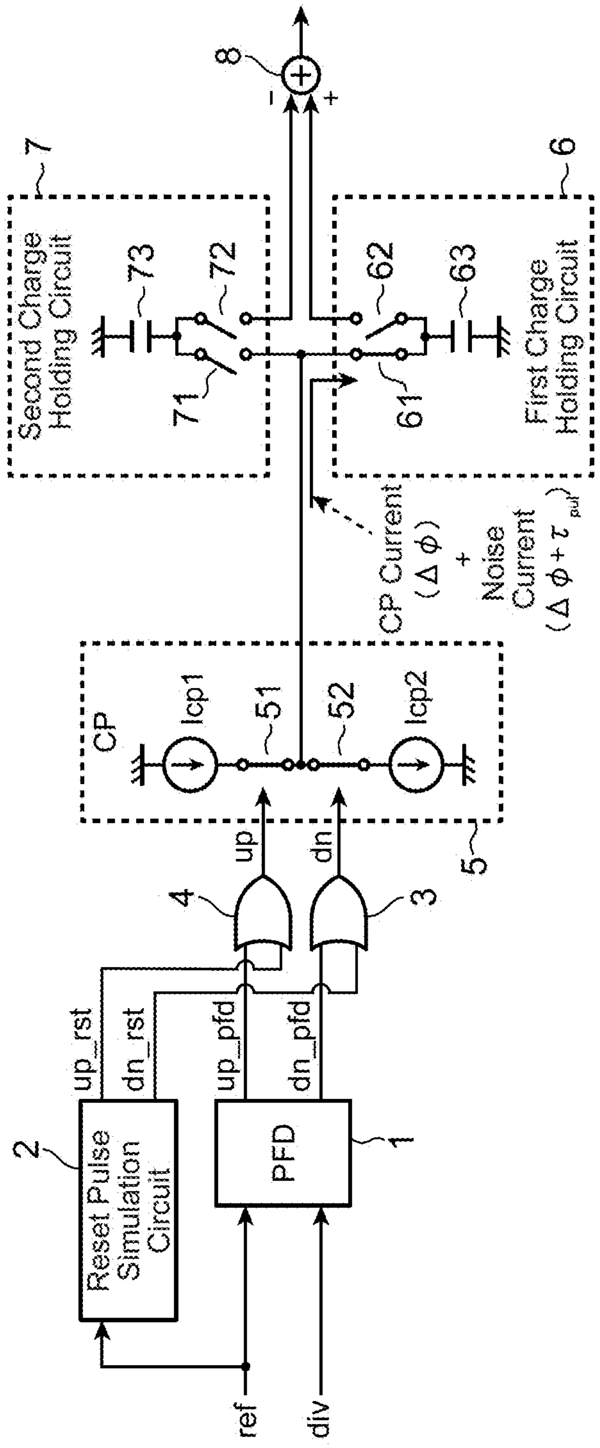
FIG. 3 is a diagram illustrating the phase comparator during operation in mode 1 in the first embodiment.

At this time, in the first switched capacitor circuit SC1, as illustrated in FIG. 3, only the switch 61 of the first charge holding circuit 6 is turned on, and the other switches are turned off. Note that on/off of each switch is controlled by, for example, a control circuit (not illustrated).

For example, when detecting that the voltage rising signal up_pfd and the voltage falling signal dn_pfd are output from the PFD 1, the control circuit outputs a control signal instructing to turn on to the switch 61, and outputs a control signal instructing to turn off to the other switches. The switch 61 is turned on when receiving the control signal instructing to turn on, and the other switches are turned off when receiving the control signal instructing to turn off.

As a result, the charge in accordance with the first current output from the CP 5 is held in the capacitor 63 of the first charge holding circuit 6. That is, the charge held in the capacitor 63 is a charge based on a current obtained by adding the charge pump current Icp output from the CP 5 depending on a phase comparison result between the reference clock signal ref and the feedback clock signal div by the PFD 1 and the noise current Inoise generated due to the parasitic capacitor included in the CP 5.

(Mode 2: Time t2 to t3)

In mode 2, the PFD 1 does not output the voltage rising signal up_pfd and the voltage falling signal dn_pfd.

The reset pulse simulation circuit 2 outputs the rising reset signal up_rst and the falling reset signal dn_rst having pulse widths corresponding to the pulse width τpul of the voltage rising signal up_pfd and the voltage falling signal dn_pfd output from the PFD 1 when the phase difference between the reference clock signal ref and the feedback clock signal div is zero. The reset pulse simulation circuit 2 outputs the rising reset signal up_rst and the falling reset signal dn_rst every time the PFD 1 completes outputting of the voltage rising signal up_pfd and the voltage falling signal dn_pfd, and here, the reset pulse simulation circuit 2 outputs the rising reset signal up_rst and the falling reset signal dn_rst, for example, in synchronization with a falling edge of the reference clock signal ref.

The OR circuit 3 outputs the falling reset signal dn_rst output from the reset pulse simulation circuit 2 as a signal dn. The OR circuit 4 outputs the rising reset signal up_rst output from the reset pulse simulation circuit 2 as a signal up.

In the CP 5, the switch 51 is turned on in response to the signal up output from the OR circuit 4, and the switch 52 is also turned on in response to the signal dn output from the OR circuit 3.

In this case, the CP 5 does not output the charge pump current Icp because the phase difference between the signal up and the signal dn is zero, but outputs the noise current Inoise for the time of the pulse width τpul of the reset pulse signal. As a result, in mode 2, the noise current Inoise is output from the CP 5 as the second current.

Figure 4:
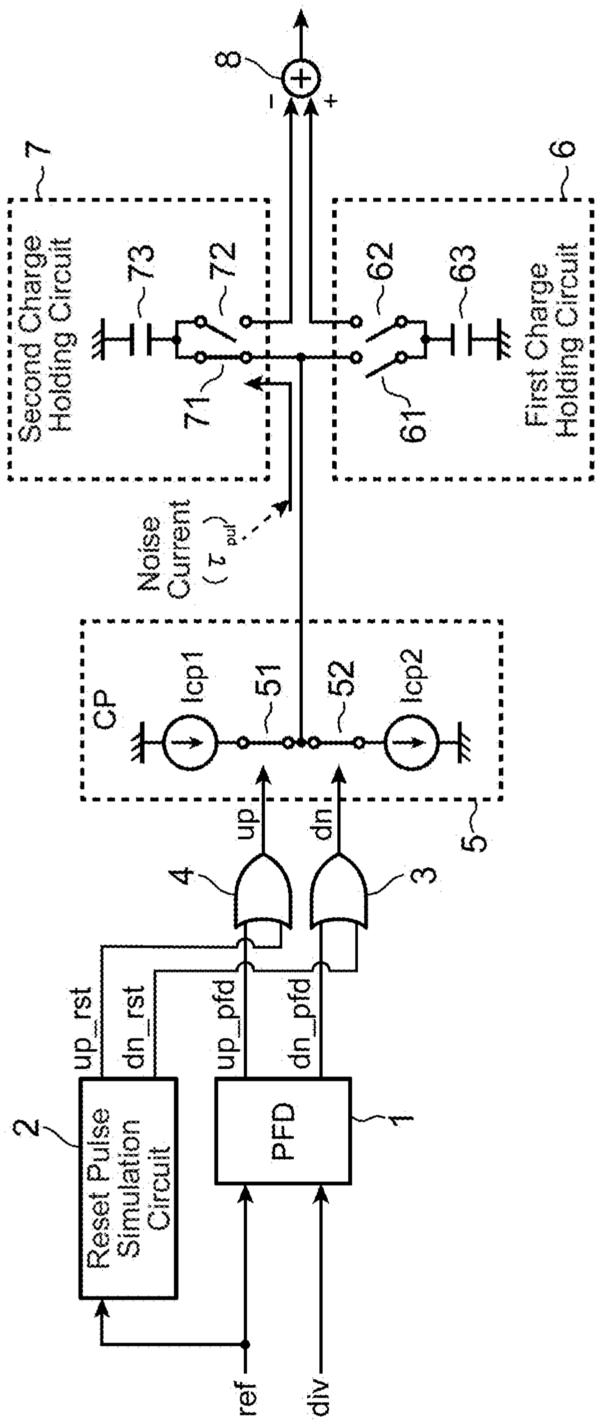
FIG. 4 is a diagram illustrating the phase comparator during operation in mode 2 in the first embodiment.

At this time, in the first switched capacitor circuit SC1, as illustrated in FIG. 4, only the switch 71 of the second charge holding circuit 7 is turned on, and the other switches are turned off. Note that on/off of each switch is controlled by, for example, a control circuit (not illustrated).

For example, when detecting that the rising reset signal up_rst and the falling reset signal dn_rst are output from the reset pulse simulation circuit 2, the control circuit outputs a control signal instructing to turn on to the switch 71 and outputs a control signal instructing to turn off to the other switches. The switch 71 is turned on when receiving the control signal instructing to turn on, and the other switches are turned off when receiving the control signal instructing to turn off.

As a result, the charge in accordance with the second current output from the CP 5 is held in the capacitor 73 of the second charge holding circuit 7. That is, the charge held in the capacitor 73 is a charge based on the noise current Inoise generated due to the parasitic capacitor included in the CP 5.

(Mode 3: Time t3 to t4 (Time t1 of the Next Period))

Figure 5:
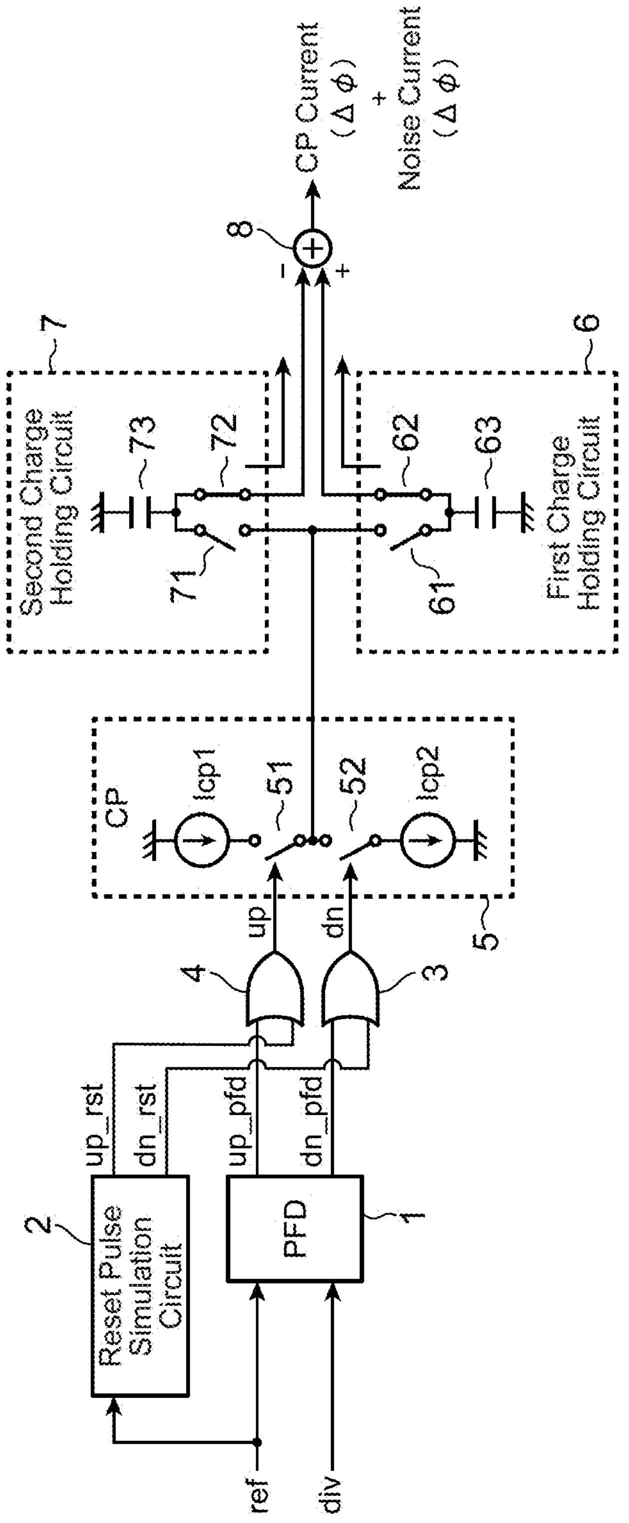
FIG. 5 is a diagram illustrating the phase comparator during operation in mode 3 in the first embodiment.

In mode 3, in the first switched capacitor circuit SC1, as illustrated in FIG. 5, the switch 62 of the first charge holding circuit 6 and the switch 72 of the second charge holding circuit 7 are turned on, and the other switches are turned off. Note that on/off of each switch is controlled by, for example, a control circuit (not illustrated).

For example, when the outputs of the signals from both the PFD 1 and the reset pulse simulation circuit 2 are not detected, the control circuit outputs a control signal instructing to turn on to the switch 62 and the switch 72, and outputs a control signal instructing to turn off to the other switches. The switches 62 and 72 are turned on when receiving the control signal instructing to turn on, and the other switches are turned off when receiving the control signal instructing to turn off.

The subtraction circuit 8 calculates a difference between the charge held by the capacitor 63 of the first charge holding circuit 6 and the charge held by the capacitor 73 of the second charge holding circuit 7, and outputs a current based on the difference. Thus, the phase comparator according to the first embodiment can output a current in which the noise current Inoise is reduced by the time corresponding to the pulse width τpul of the reset pulse signal.

Figure 6:
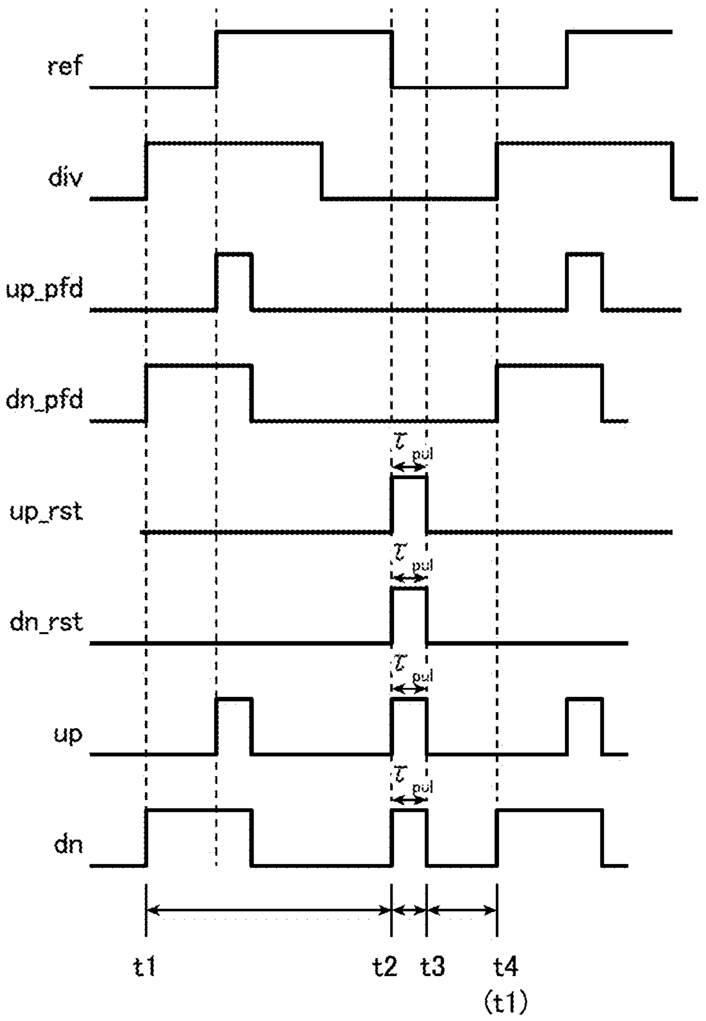
FIG. 6 is a diagram illustrating an example of waveforms of signals (in a case where a phase of the reference clock signal is delayed from a phase of the feedback clock signal) in the first embodiment.

Next, a case where the phase of the reference clock signal ref input to the PFD 1 is delayed from the phase of the feedback clock signal div will be described. FIG. 6 is a diagram illustrating an example of waveforms of respective signals output from the PFD 1, the reset pulse simulation circuit 2, the OR circuit 3, and the OR circuit 4 in a case where the phase of the reference clock signal ref input to the PFD 1 is delayed from the phase of the feedback clock signal div. Note that, in FIG. 6, the horizontal axis represents time.

(Mode 1: Time t1 to t2)

The PFD 1 outputs the voltage rising signal up_pfd and the voltage falling signal dn_pfd depending on the phase difference between the reference clock signal ref and the feedback clock signal div. When the phase of the reference clock signal ref is delayed from the phase of the feedback clock signal div, the voltage falling signal dn_pfd output from the PFD 1 rises earlier than the voltage rising signal up_pfd as illustrated in FIG. 6.

The reset pulse simulation circuit 2 does not output the rising reset signal up_rst and the falling reset signal dn_rst in mode 1.

The OR circuit 3 outputs the voltage falling signal dn_pfd output from the PFD 1 as a signal dn. The OR circuit 4 outputs the voltage rising signal up_pfd output from the PFD 1 as a signal up.

In the CP 5, the switch 51 is turned on in response to the signal up output from the OR circuit 4. Further, in the CP 5, the switch 52 is turned on behind the switch 51 in response to the signal dn output from the OR circuit 3.

In this case, the CP 5 outputs the charge pump current Icp for a time corresponding to the phase difference ΔΦ between the signal up and the signal dn, in other words, for a time corresponding to the phase difference ΔΦ between the reference clock signal ref and the feedback clock signal div. Further, the CP 5 outputs the noise current Inoise for a time obtained by adding a time corresponding to the pulse width τpul of the reset signal to a time corresponding to the phase difference ΔΦ between the signal up and the signal dn. As a result, in mode 1, the CP 5 outputs, as the first current, a current obtained by adding the noise current Inoise to the charge pump current Icp.

At this time, in the first switched capacitor circuit SC1, as illustrated in FIG. 3, only the switch 61 of the first charge holding circuit 6 is turned on, and the other switches are turned off. Note that on/off of each switch is controlled by, for example, the control circuit (not illustrated) in a manner similar to the above.

As a result, the charge in accordance with the first current output from the CP 5 is held in the capacitor 63 of the first charge holding circuit 6. That is, the charge held in the capacitor 63 is a charge based on a current obtained by adding the charge pump current Icp output from the CP 5 depending on a phase comparison result between the reference clock signal ref and the feedback clock signal div by the PFD 1 and the noise current Inoise generated due to the parasitic capacitor included in the CP 5.

(Mode 2: Time t2 to t3)

In mode 2, the PFD 1 does not output the voltage rising signal up_pfd and the voltage falling signal dn_pfd.

The reset pulse simulation circuit 2 outputs the rising reset signal up_rst and the falling reset signal dn_rst having pulse widths corresponding to the pulse width τpul of the voltage rising signal up_pfd and the voltage falling signal dn_pfd output from the PFD 1 when the phase difference between the reference clock signal ref and the feedback clock signal div is zero. The reset pulse simulation circuit 2 outputs the rising reset signal up_rst and the falling reset signal dn_rst every time the PFD 1 completes outputting of the voltage rising signal up_pfd and the voltage falling signal dn_pfd, and here, the reset pulse simulation circuit 2 outputs the rising reset signal up_rst and the falling reset signal dn_rst, for example, in synchronization with a falling edge of the reference clock signal ref.

The OR circuit 3 outputs the falling reset signal dn_rst output from the reset pulse simulation circuit 2 as a signal dn. The OR circuit 4 outputs the rising reset signal up_rst output from the reset pulse simulation circuit 2 as a signal up.

In the CP 5, the switch 51 is turned on in response to the signal up output from the OR circuit 4, and the switch 52 is also turned on in response to the signal dn output from the OR circuit 3.

In this case, the CP 5 does not output the charge pump current Icp because the phase difference between the signal up and the signal dn is zero, but outputs the noise current Inoise for the time of the pulse width τpul of the reset pulse signal. As a result, in mode 2, the noise current Inoise is output from the CP 5 as the second current.

At this time, in the first switched capacitor circuit SC1, as illustrated in FIG. 4, only the switch 71 of the second charge holding circuit 7 is turned on, and the other switches are turned off. Note that on/off of each switch is controlled by, for example, the control circuit (not illustrated) in a manner similar to the above.

As a result, the charge in accordance with the second current output from the CP 5 is held in the capacitor 73 of the second charge holding circuit 7. That is, the charge held in the capacitor 73 is a charge based on the noise current Inoise generated due to the parasitic capacitor included in the CP 5.

(Mode 3: Time t3 to t4 (Time t1 of the Next Period))

In mode 3, in the first switched capacitor circuit SC1, as illustrated in FIG. 5, the switch 62 of the first charge holding circuit 6 and the switch 72 of the second charge holding circuit 7 are turned on, and the other switches are turned off. Note that on/off of each switch is controlled by, for example, the control circuit (not illustrated) in a manner similar to the above.

The subtraction circuit 8 calculates a difference between the charge held by the capacitor 63 of the first charge holding circuit 6 and the charge held by the capacitor 73 of the second charge holding circuit 7, and outputs a current based on the difference. Thus, the phase comparator according to the first embodiment can output a current in which the noise current Inoise is reduced by the time corresponding to the pulse width τpul of the reset pulse signal.

Figure 7:
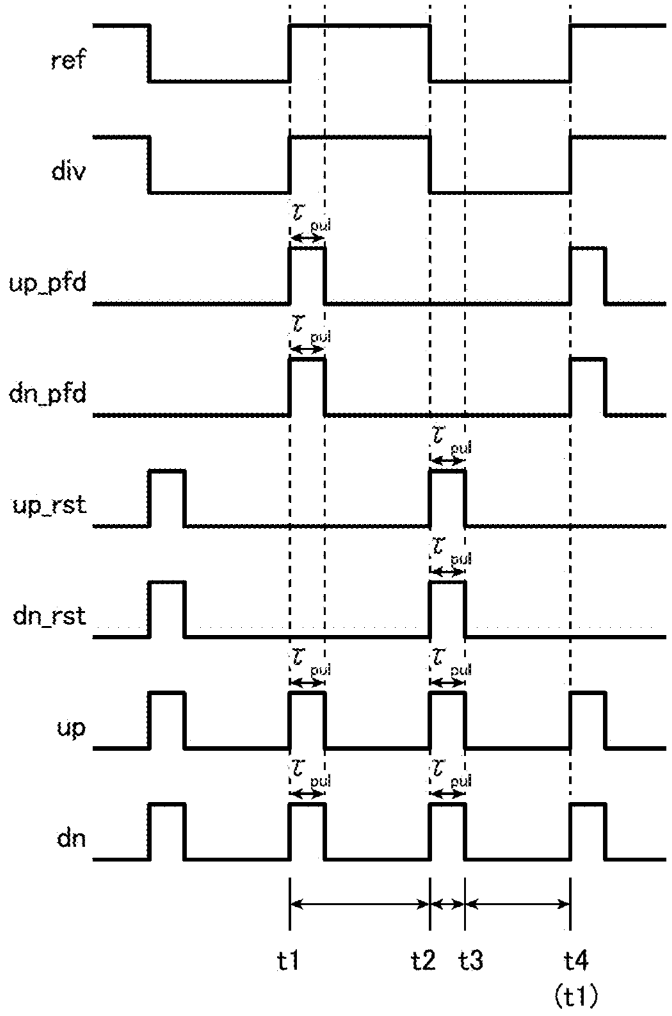
FIG. 7 is a diagram illustrating an example of waveforms of signals (in a case where a phase difference between the reference clock signal and the feedback clock signal is zero) in the first embodiment.

Next, a case where the phase difference between the reference clock signal ref and the feedback clock signal div input to the PFD 1 is zero will be described. FIG. 7 is a diagram illustrating an example of waveforms of respective signals output from the PFD 1, the reset pulse simulation circuit 2, the OR circuit 3, and the OR circuit 4 in a case where the phase difference between the reference clock signal ref and the feedback clock signal div input to the PFD 1 is zero. Note that, in FIG. 7, the horizontal axis represents time.

(Mode 1: Time t1 to t2)

The PFD 1 outputs the voltage rising signal up_pfd and the voltage falling signal dn_pfd depending on the phase difference between the reference clock signal ref and the feedback clock signal div. When the phase difference between the reference clock signal ref and the feedback clock signal div is zero, the PFD 1 outputs the voltage rising signal up_pfd and the voltage falling signal dn_pfd as reset pulse signals having a pulse width τpul.

The reset pulse simulation circuit 2 does not output the rising reset signal up_rst and the falling reset signal dn_rst in mode 1.

The OR circuit 3 outputs the voltage falling signal dn_pfd output from the PFD 1 as a signal dn. The OR circuit 4 outputs the voltage rising signal up_pfd output from the PFD 1 as a signal up.

In the CP 5, the switch 51 is turned on in response to the signal up output from the OR circuit 4, and the switch 52 is turned on in response to the signal dn output from the OR circuit 3.

In this case, the CP 5 does not output the charge pump current Icp because the phase difference between the signal up and the signal dn is zero, but outputs the noise current Inoise for the time of the pulse width τpul of the reset pulse signal. As a result, in mode 1, the noise current Inoise is output from the CP 5 as the first current.

At this time, in the first switched capacitor circuit SC1, as illustrated in FIG. 3, only the switch 61 of the first charge holding circuit 6 is turned on, and the other switches are turned off. Note that on/off of each switch is controlled by, for example, the control circuit (not illustrated) in a manner similar to the above.

As a result, the charge in accordance with the first current output from the CP 5 is held in the capacitor 63 of the first charge holding circuit 6. That is, the charge held in the capacitor 63 is a charge based on the noise current Inoise generated due to the parasitic capacitor included in the CP 5.

(Mode 2: Time t2 to t3)

In mode 2, the PFD 1 does not output the voltage rising signal up_pfd and the voltage falling signal dn_pfd.

The reset pulse simulation circuit 2 outputs the rising reset signal up_rst and the falling reset signal dn_rst having pulse widths corresponding to the pulse width τpul of the voltage rising signal up_pfd and the voltage falling signal dn_pfd output from the PFD 1 when the phase difference between the reference clock signal ref and the feedback clock signal div is zero. The reset pulse simulation circuit 2 outputs the rising reset signal up_rst and the falling reset signal dn_rst every time the PFD 1 completes outputting of the voltage rising signal up_pfd and the voltage falling signal dn_pfd, and here, the reset pulse simulation circuit 2 outputs the rising reset signal up_rst and the falling reset signal dn_rst, for example, in synchronization with a falling edge of the reference clock signal ref.

The OR circuit 3 outputs the falling reset signal dn_rst output from the reset pulse simulation circuit 2 as a signal dn. The OR circuit 4 outputs the rising reset signal up_rst output from the reset pulse simulation circuit 2 as a signal up.

In the CP 5, the switch 51 is turned on in response to the signal up output from the OR circuit 4, and the switch 52 is also turned on in response to the signal dn output from the OR circuit 3.

In this case, the CP 5 does not output the charge pump current Icp because the phase difference between the signal up and the signal dn is zero, but outputs the noise current Inoise for the time of the pulse width τpul of the reset pulse signal. As a result, in mode 2, the noise current Inoise is output from the CP 5 as the second current.

At this time, in the first switched capacitor circuit SC1, as illustrated in FIG. 4, only the switch 71 of the second charge holding circuit 7 is turned on, and the other switches are turned off. Note that on/off of each switch is controlled by, for example, the control circuit (not illustrated) in a manner similar to the above.

As a result, the charge in accordance with the second current output from the CP 5 is held in the capacitor 73 of the second charge holding circuit 7. That is, the charge held in the capacitor 73 is a charge based on the noise current Inoise generated due to the parasitic capacitor included in the CP 5.

(Mode 3: Time t3 to t4 (time t1 of the Next Period))

In mode 3, in the first switched capacitor circuit SC1, as illustrated in FIG. 5, the switch 62 of the first charge holding circuit 6 and the switch 72 of the second charge holding circuit 7 are turned on, and the other switches are turned off. Note that on/off of each switch is controlled by, for example, the control circuit (not illustrated) in a manner similar to the above.

The subtraction circuit 8 calculates a difference between the charge held by the capacitor 63 of the first charge holding circuit 6 and the charge held by the capacitor 73 of the second charge holding circuit 7, and outputs a current based on the difference. In this case, since the charge difference is zero, the current output from the subtraction circuit 8 is also zero.

Note that the above-described effect of reducing the noise current Inoise is effective when a frequency component of the noise current Inoise is sufficiently small with respect to a reciprocal of the difference between a time during which the first charge holding circuit 6 holds a charge in the capacitor 63 and a time during which the second charge holding circuit 7 holds a charge in the capacitor 73. In this regard, in the first embodiment, the purpose is to suppress the phase noise in the low offset frequency region, so that it can be said that the above relationship is established. Therefore, in the first embodiment, an effect of reducing the noise current Inoise can be expected.

Further, in the first embodiment, as illustrated in FIG. 2, the timing at which the CP 5 outputs a current is twice, that is, that of a case of responding to the voltage rising signal up_pfd and the voltage falling signal dn_pfd output from the PFD 1 (mode 1) and that of a case of responding to the rising reset signal up_rst and the falling reset signal dn_rst output from the reset pulse simulation circuit 2 (mode 2) per period. Furthermore, assuming that mode 1 to mode 3 are one period, in the first embodiment, the two timings exist for each period. In the first embodiment, among the two outputs, the charge in accordance with the current output in mode 1 is held in the capacitor 63 of the first charge holding circuit 6, the charge in accordance with the current output in mode 2 is held in the capacitor 73 of the second charge holding circuit 7, and a current based on the difference between these charges is output in mode 3. As described above, in the first embodiment, since the operations of modes 1 to 3 are executed within one period of the phase comparison frequency, it is possible to suppress the influence on loop stability by increasing the period, which is problematic in the conventional method.

As described above, according to the first embodiment, the phase comparator includes the phase frequency comparator (PFD) 1 to compare phases of the reference clock signal ref and the feedback clock signal div, and output the voltage rising signal up_pfd and the voltage falling signal dn_pfd on the basis of a difference of the phases, the reset pulse simulation circuit 2 to output the rising reset signal up_rst and the falling reset signal dn_rst having the pulse width corresponding to the pulse widths of the voltage rising signal up_pfd and the voltage falling signal dn_pfd output from the phase frequency comparator (PFD) 1 when the phase difference between the reference clock signal ref and the feedback clock signal div is zero every time the phase frequency comparator (PFD) 1 completes outputting of the voltage rising signal up_pfd and the voltage falling signal dn_pfd, a charge pump circuit 5 to output a first current on the basis of the voltage rising signal up_pfd and the voltage falling signal dn_pfd output from the phase frequency comparator (PFD) 1, and output a second current on the basis of the rising reset signal up_rst and the falling reset signal dn_rst output from the reset pulse simulation circuit 2, and a current output circuit having a capacitor capable of being charged with a charge in accordance with the first current output from the charge pump circuit 5 and a charge in accordance with the second current output from the charge pump circuit, the current output circuit being to output a current based on a difference between the charge in accordance with the first current and the charge in accordance with the second current that are charged in the capacitor. Thus, the phase comparator according to the first embodiment can obtain an effect of suppressing the phase noise in the low offset frequency region without impairing loop stability as compared with the conventional method.

Further, the current output circuit includes the capacitor 63 and the capacitor 73 as the capacitor, the first switched capacitor circuit SC1 to charge the capacitor 63 with a charge in accordance with a first current output from the charge pump circuit 5 and charge the capacitor 73 with a charge in accordance with a second current output from the charge pump circuit 5, and the subtraction circuit 8 to calculate a difference between the charge charged in the capacitor 63 and the charge charged in the capacitor 73, and output a current based on the calculated difference. Thus, the phase comparator according to the first embodiment can charge the charge in accordance with the first current and the charge in accordance with the second current to different capacitors, and can accurately calculate the difference.

Furthermore, according to the first embodiment, the PLL circuit includes the phase comparator, the loop filter to generate and output a voltage on the basis of the current output from the phase comparator, the voltage-controlled oscillator to generate and output an output clock signal having a frequency corresponding to the voltage output from the loop filter, and the variable frequency divider to frequency-divide the output clock signal output from the voltage-controlled oscillator and output a frequency-divided output clock signal to the phase frequency comparator (PFD) 1 as the feedback clock signal div. Thus, the PLL circuit according to the first embodiment can obtain an effect similar to the effect of the phase comparator.

Second Embodiment

In the first embodiment, the phase comparator including the PFD 1, the reset pulse simulation circuit 2, the OR circuit 3, and the OR circuit 4 has been described as a configuration of a preceding stage of the CP 5. In a second embodiment, a phase comparator capable of further simplifying the configuration of the preceding stage of the CP 5 will be described.

Figure 8:
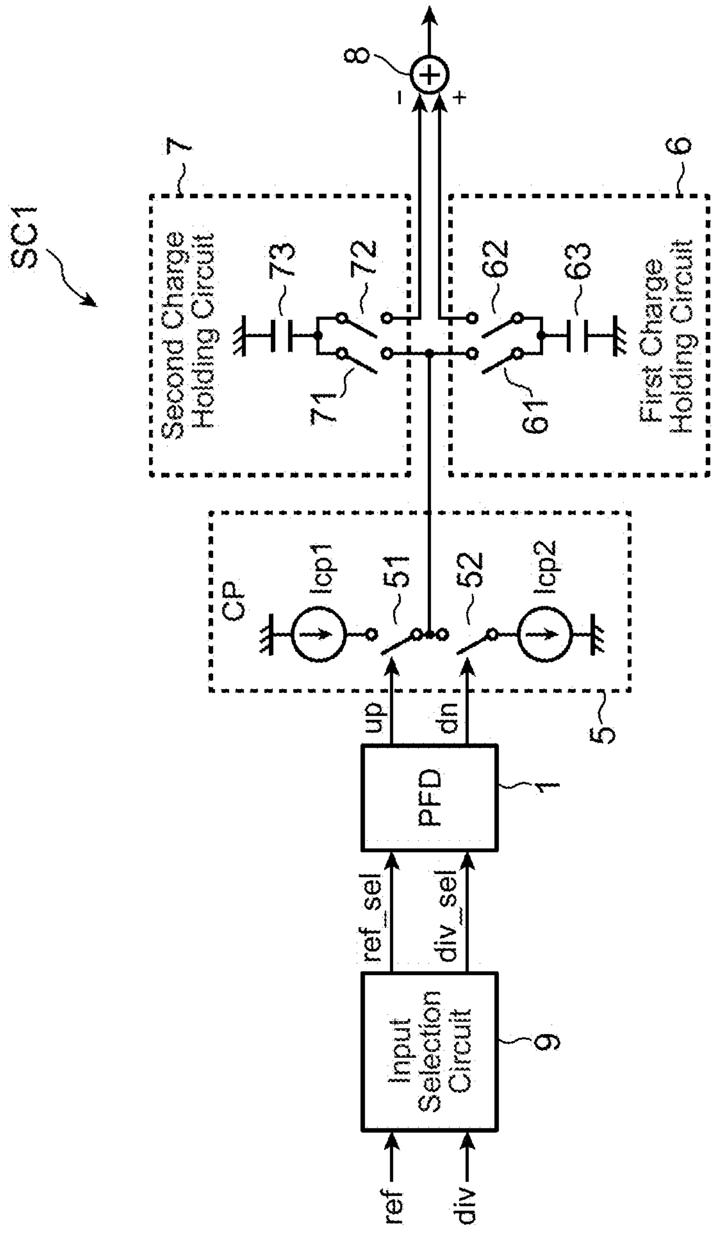
FIG. 8 is a diagram illustrating a configuration example of a phase comparator included in a PLL circuit according to a second embodiment.

FIG. 8 is a diagram illustrating a configuration example of a phase comparator included in a PLL circuit according to the second embodiment. In the phase comparator in the second embodiment, the reset pulse simulation circuit 2, the OR circuit 3, and the OR circuit 4 are deleted, and an input selection circuit 9 is added, as compared with the first embodiment. In the second embodiment, functions similar to those of the PFD 1, the reset pulse simulation circuit 2, the OR circuit 3, and the OR circuit 4 in the first embodiment are implemented by the PFD 1 and the input selection circuit 9. Since the other configurations of the phase comparator in the second embodiment are the same as those in the first embodiment, the same reference numerals are given and the description thereof will be omitted.

The input selection circuit 9 includes two input terminals and two output terminals. A reference clock signal ref is input to the first input terminal of the input selection circuit 9. A feedback clock signal div is input to the second input terminal of the input selection circuit 9.

The input selection circuit 9 generates and outputs two signals ref_sel and div_sel for causing the PFD 1 to perform phase comparison on the basis of the reference clock signal ref and the feedback clock signal div.

Specifically, the input selection circuit 9 outputs a first signal pair including a signal ref_sel rising in synchronization with a rising edge of the reference clock signal ref and a signal div_sel rising in synchronization with a rising edge of the feedback clock signal div with respect to the input reference clock signal ref and the feedback clock signal div. Further, the input selection circuit 9 outputs a second signal pair including two signals ref_sel and div_sel having the same phase. The input selection circuit 9 alternately outputs the first signal pair and the second signal pair.

Next, an operation example of the phase comparator according to the second embodiment will be described with reference to FIG. 9. Similarly to the phase comparator according to the first embodiment, the phase comparator according to the second embodiment operates mainly in three modes of mode 1, mode 2, and mode 3. Hereinafter, an operation example of the phase comparator in each mode will be described in detail.

Note that, here, a case where a phase of the reference clock signal ref input to the input selection circuit 9 is advanced from a phase of the feedback clock signal div will be described as an example. However, in a case where the phase of the reference clock signal ref is delayed from the phase of the feedback clock signal div, and in a case where a phase difference between the reference clock signal ref and the feedback clock signal div is zero, the phase comparator operates similarly to the following.

Figure 9:
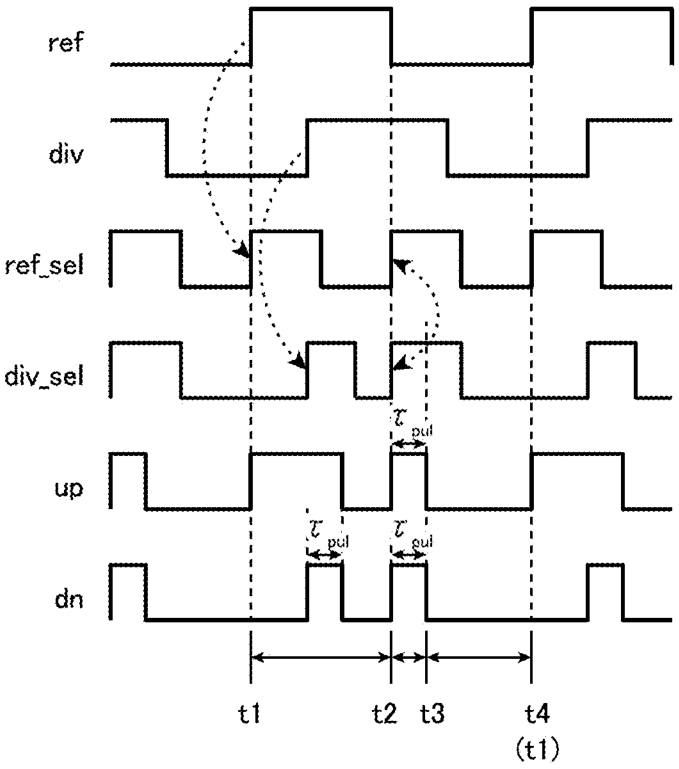
FIG. 9 is a diagram illustrating an example of waveforms of signals (in a case where a phase of a reference clock signal is advanced from a phase of a feedback clock signal) in the second embodiment.

FIG. 9 is a diagram illustrating an example of waveforms of respective signals output from the input selection circuit 9 and the PFD 1 in a case where the phase of the reference clock signal ref input to the input selection circuit 9 is advanced from the phase of the feedback clock signal div. Note that, in FIG. 9, the horizontal axis represents time.

(Mode 1: Time t1 to t2)

In mode 1, the input selection circuit 9 outputs a first signal pair including a signal ref_sel rising in synchronization with rising edges of the reference clock signal ref and a signal div_sel rising in synchronization with a rising edge of the feedback clock signal div with respect to the input reference clock signal ref and the feedback clock signal div. In other words, the input selection circuit 9 allows the rising edge out of two edges (the rising edge and the falling edge) of the reference clock signal ref and the feedback clock signal div to pass as it is. The edge allowed to pass by the input selection circuit 9 is, for example, the edge on which the input selection circuit 9 causes the PFD 1 to perform phase comparison.

For example, in the example of FIG. 9, the input selection circuit 9 allows the rising edge out of the rising edge and the falling edge of the reference clock signal ref and the feedback clock signal div to pass as it is. That is, the input selection circuit 9 generates and outputs the signals ref_sel and div_sel rising in synchronization with the rising edges of the reference clock signal ref and the feedback clock signal div as the first signal pair.

The PFD 1 outputs the signal up and the signal dn depending on a phase difference between the signals ref_sel and div_sel included in the first signal pair output from the input selection circuit 9. In a case where the phase of the reference clock signal ref is advanced from the phase of the feedback clock signal div, the signal dn_pfd output from the PFD 1 rises slower than the signal up_pfd as illustrated in FIG. 9.

In the CP 5, the switch 51 is turned on in response to the signal up output from the PFD 1. Further, in the CP 5, the switch 52 is turned on behind the switch 51 in response to the signal dn output from the PFD 1.

In this case, the CP 5 outputs the charge pump current Icp for a time corresponding to the phase difference $\Delta\Phi$ between the signals ref_sel and div_sel, in other words, for a time corresponding to the phase difference $\Delta\Phi$ between the reference clock signal ref and the feedback clock signal div. Further, the CP 5 outputs a noise current Inoise for a time obtained by adding a time corresponding to the pulse width $\tau$pul of the reset signal to a time corresponding to the phase difference $\Delta\Phi$ between the signal ref_sel and the signal div_sel. As a result, in mode 1, the CP 5 outputs, as the first current, a current obtained by adding the noise current Inoise to the charge pump current Icp.

At this time, in the first switched capacitor circuit SC1, as illustrated in FIG. 3, only the switch 61 of the first charge holding circuit 6 is turned on, and the other switches are turned off. Note that on/off of each switch is controlled by, for example, the control circuit (not illustrated) in a manner similar to the above.

As a result, the charge in accordance with the first current output from the CP 5 is held in the capacitor 63 of the first charge holding circuit 6. That is, the charge held in the capacitor 63 is a charge based on a current obtained by adding the charge pump current Icp output from the CP 5 depending on a phase comparison result between the signal up and the signal dn, that is, the phase comparison result between the reference clock signal ref and the feedback clock signal div by the PFD 1, and the noise current Inoise generated due to the parasitic capacitor included in the CP 5.

(Mode 2: Time t2 to t3)

Mode 2 is started at a timing sufficiently away from the edge (rising edge in this case) of the reference clock signal ref on which the PFD 1 performs the phase comparison in mode 1. Here, mode 2 is started near the falling edge of the reference clock signal ref (time t2).

In mode 2, the input selection circuit 9 generates and outputs a second signal pair including two signals ref_sel and div_sel having the same phase. The signals ref_sel and div_sel are signals that rise in synchronization with the falling edge of the reference clock signal ref, and are signals obtained by inverting the reference clock signal ref at time t2. The signals ref_sel and div_sel output from the input selection circuit 9 are input to the PFD 1.

Inputting two signals having the same phase into the PFD 1 simulates a state in which the PFD 1 detects a phase difference of zero between the two signals. That is, in the second embodiment, functions similar to those of the PFD 1, the reset pulse simulation circuit 2, the OR circuit 3, and the OR circuit 4 in the first embodiment are implemented by the PFD 1 and the input selection circuit 9.

The phase difference between the signals ref_sel and div_sel included in the second signal pair output from the input selection circuit 9 is zero, and thus the PFD 1 outputs the signal up and the signal dn having the pulse width τpul as reset pulse signals.

In the CP 5, the switch 51 is turned on in response to the signal up output from the PFD 1, and the switch 52 is also turned on in response to the signal dn output from the PFD 1.

In this case, the CP 5 does not output the charge pump current Icp because the phase difference between the signal up and the signal dn is zero, but outputs the noise current Inoise for the time of the pulse width τpul of the reset pulse signal. As a result, in mode 2, the noise current Inoise is output from the CP 5 as the second current.

At this time, in the first switched capacitor circuit SC1, as illustrated in FIG. 4, only the switch 71 of the second charge holding circuit 7 is turned on, and the other switches are turned off. Note that on/off of each switch is controlled by, for example, the control circuit (not illustrated) in a manner similar to the above.

As a result, the charge in accordance with the second current output from the CP 5 is held in the capacitor 73 of the second charge holding circuit 7. That is, the charge held in the capacitor 73 is a charge based on the noise current Inoise generated due to the parasitic capacitor included in the CP 5.

(Mode 3: Time t3 to t4 (Time t1 of the Next Period))

In mode 3, in the first switched capacitor circuit SC1, as illustrated in FIG. 5, the switch 62 of the first charge holding circuit 6 and the switch 72 of the second charge holding circuit 7 are turned on, and the other switches are turned off. Note that on/off of each switch is controlled by, for example, the control circuit (not illustrated) in a manner similar to the above.

The subtraction circuit 8 calculates a difference between the charge held by the capacitor 63 of the first charge holding circuit 6 and the charge held by the capacitor 73 of the second charge holding circuit 7, and outputs a current based on the difference. Thus, the phase comparator according to the first embodiment can output a current in which the noise current Inoise is reduced by the time corresponding to the pulse width τpul of the reset pulse signal.

Note that, also in the second embodiment, similarly to the first embodiment, it is possible to obtain the effect of suppressing the phase noise in the low offset frequency region while suppressing the influence on loop stability. In addition, in the second embodiment, the configuration of the preceding stage of the CP 5 can be further simplified as compared with the first embodiment.

Note that, in the above description, an example in which the input selection circuit 9 sets the edge that causes the PFD 1 to perform phase comparison out of the rising edge and the falling edge of the reference clock signal ref and the feedback clock signal div as a rising edge, that is, an example in which the input selection circuit 9 allows the rising edge of the reference clock signal ref and the feedback clock signal div to pass as it is has been described. However, the input selection circuit 9 is not limited thereto, and the edge that causes the PFD 1 to perform phase comparison may be set as a falling edge, and the falling edge of the reference clock signal ref and the feedback clock signal div may be allowed to pass as it is.

In that case, in mode 1, the input selection circuit 9 generates and outputs a first signal pair including a signal ref_sel falling in synchronization with a falling edge of the reference clock signal ref and a signal div_sel falling in synchronization with a falling edge of the feedback clock signal div with respect to the input reference clock signal ref and feedback clock signal div.

Further, mode 2 is started, for example, near the rising edge of the reference clock signal ref. In mode 2, the input selection circuit 9 generates and outputs a second signal pair including two signals ref_sel and div_sel having the same phase. The signals ref_sel and div_sel are signals that rise in synchronization with the rising edge of the reference clock signal ref. Furthermore, the signals ref_sel and div_sel included in the second signal pair and the signals ref_sel and div_sel included in the first signal pair are independent of each other. Note that, in mode 3, the phase comparator operates in a manner similar to the above.

As described above, according to the second embodiment, the phase comparator includes the input selection circuit 9 to alternately perform, with respect to the inputs of the reference clock signal ref and the feedback clock signal div, an output of a first signal pair including the signal ref_sel rising in synchronization with the rising edge of the reference clock signal ref and the signal div_sel rising in synchronization with the rising edge of the feedback clock signal div, or an output of the first signal pair including the signal ref_sel falling in synchronization with the falling edge of the reference clock signal ref and the signal div_sel falling in synchronization with the falling edge of the feedback clock signal div, and an output of a second signal pair including the two signals ref_sel and div_sel having the same phase, a phase frequency comparator (PFD) 1 to output a voltage rising signal up and a voltage falling signal dn on the basis of a phase difference of signals included in a first signal pair output from the input selection circuit 9 and a phase difference of signals included in a second signal pair output from the input selection circuit 9, a charge pump circuit 5 to output a first current on the basis of the voltage rising signal up and the voltage falling signal dn output on the basis of the phase difference of the signals included in the first signal pair and output a second current on the basis of the voltage rising signal up and the voltage falling signal dn output on the basis of the phase difference of the signals included in the second signal pair, out of the voltage rising signal up and the voltage falling signal dn output from the phase frequency comparator (PFD) 1, and a current output circuit having a capacitor capable of being charged with a charge in accordance with the first current output from the charge pump circuit 5 and a charge in accordance with the second current output from the charge pump circuit 5, the current output circuit being to output a current based on a difference between the charge in accordance with the first current and the charge in accordance with the second current that are charged in the capacitor. Thus, the phase comparator according to the second embodiment can simplify the configuration of the preceding stage of the CP 5 as compared with the first embodiment in addition to the effects of the first embodiment.

Third Embodiment

In the first embodiment and the second embodiment, the phase comparator in which the current output circuit includes the first switched capacitor circuit SC1 (the first charge holding circuit 6 and the second charge holding circuit 7) and the subtraction circuit 8 has been described. In a third embodiment, a phase comparator in which a current output circuit is configured by a second switched capacitor circuit SC2 will be described.

Figure 10:
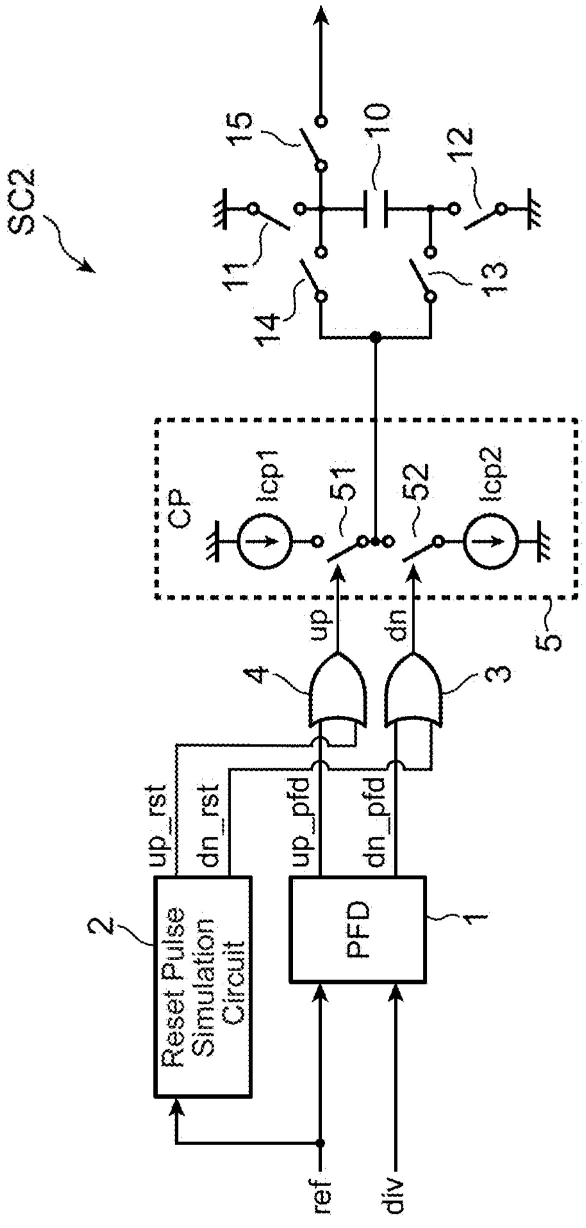
FIG. 10 is a diagram illustrating a configuration example of a phase comparator included in a PLL circuit according to a third embodiment.

FIG. 10 is a diagram illustrating a configuration example of a phase comparator included in a PLL circuit according to the third embodiment. The phase comparator according to the third embodiment is obtained by removing the first switched capacitor circuit SC1 (the first charge holding circuit 6 and the second charge holding circuit 7) and the subtraction circuit 8, and adding the second switched capacitor circuit SC2, as compared with the first embodiment. That is, in the phase comparator according to the third embodiment, the current output circuit is configured by the second switched capacitor circuit SC2. Since the other configurations of the phase comparator in the third embodiment are the same as those in the first embodiment, the same reference numerals are given and the description thereof will be omitted.

The second switched capacitor circuit SC2 includes a capacitor 10 and switches 11 to 15. The second switched capacitor circuit SC2 charges the capacitor 10 in a positive direction in accordance with the first current output from the CP 5. Further, the second switched capacitor circuit SC2 charges the capacitor 10 in a negative direction in accordance with the second current output from the CP 5. The capacitor 10 is, for example, a capacitor.

One end of the capacitor 10 is connected to one end of the switch 11, and the other end is connected to one end of the switch 12. The capacitor 10 charges the charge in the positive direction in accordance with the first current output from the CP 5 or charges the charge in the negative direction in accordance with the second current output from the CP 5.

On/off of the switches 11 to 15 is controlled by, for example, a control circuit (not illustrated). The one end of the switch 11 is connected to the one end of the capacitor 10, and the other end is connected to the ground. The one end of the switch 12 is connected to the other end of the capacitor 10, and the other end is connected to the ground.

One end of the switch 13 is connected to an output terminal of the CP 5, and the other end is connected to the other end of the capacitor 10. One end of the switch 14 is connected to the output terminal of the CP 5, and the other end is connected to the one end of the capacitor 10. One end of the switch 15 is connected to the one end of the capacitor 10, and the other end is connected to an output terminal of the phase comparator.

Next, an operation example of the phase comparator according to the third embodiment will be described with reference to FIG. 11. The phase comparator according to the third embodiment operates in four modes obtained by adding a reset mode to the three modes of mode 1, mode 2, and mode 3 described in the first embodiment. The reset mode is performed, for example, immediately before mode 1. Hereinafter, an operation example of the second switched capacitor circuit SC2 among operation examples of the phase comparator in each mode will be described in detail.

Note that the operation example of the second switched capacitor circuit SC2 described below is similar in any of a case where the phase of the reference clock signal ref input to the PFD 1 is advanced from the phase of the feedback clock signal div, a case where the phase of the reference clock signal ref is delayed from the phase of the feedback clock signal div, and a case where the phase difference between the both signals is zero.

(Reset Mode)

Figure 11A:
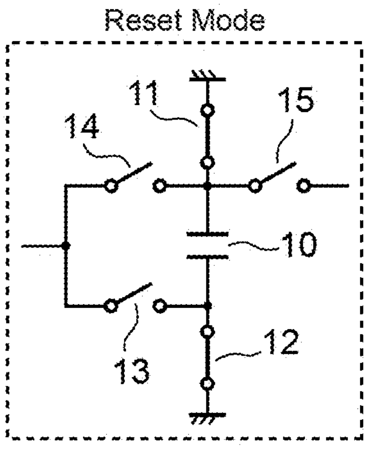

In the reset mode, in the second switched capacitor circuit SC2, as illustrated in FIG. 11A, the switch 11 and the switch 12 are turned on, and the switches 13 to 15 are turned off. The on/off of each switch is controlled by, for example, a control circuit (not illustrated).

For example, the control circuit detects a timing immediately before the voltage rising signal up_pfd and the voltage falling signal dn_pfd are output from the PFD 1, outputs a control signal instructing to turn on to the switch 11 and the switch 12, and outputs a control signal instructing to turn off to the other switches. The switches 11 and 12 are turned on when receiving the control signal instructing to turn on, and the other switches are turned off when receiving the control signal instructing to turn off. FIG. 11A illustrates a reset of the capacitor 10, and all charges held in the capacitor 10 are discharged.

(Mode 1)

Figure 11B:
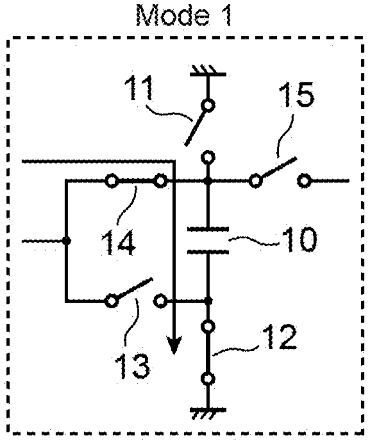

In mode 1, as described in the first embodiment, the first current is output from the CP 5. At this time, in the second switched capacitor circuit SC2, as illustrated in FIG. 11B, the switch 12 and the switch 14 are turned on, and the switch 11, the switch 13, and the switch 15 are turned off. The on/off of each switch is controlled by, for example, a control circuit (not illustrated).

For example, when detecting that the voltage rising signal up_pfd and the voltage falling signal dn_pfd are output from the PFD 1, the control circuit outputs a control signal instructing to turn on to the switch 12 and the switch 14, and outputs a control signal instructing to turn off to the other switches. The switches 12 and 14 are turned on when receiving the control signal instructing to turn on, and the other switches are turned off when receiving the control signal instructing to turn off. FIG. 11B illustrates charging of the capacitor 10 in the positive direction, and the capacitor 10 is charged with a charge in the positive direction in accordance with the first current output from the CP 5.

(Mode 2)

Figure 11C:
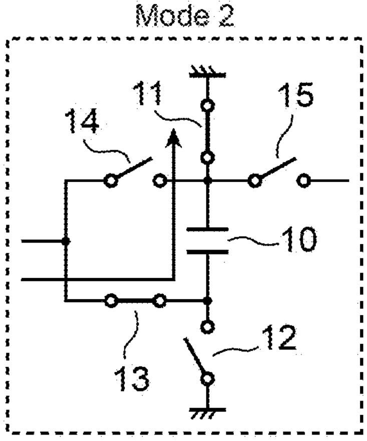

In mode 2, as described in the first embodiment, the second current is output from the CP 5. At this time, in the second switched capacitor circuit SC2, as illustrated in FIG. 11C, the switch 11 and the switch 13 are turned on, and the switch 12, the switch 14, and the switch 15 are turned off. The on/off of each switch is controlled by, for example, a control circuit (not illustrated).

For example, when detecting that the rising reset signal up_rst and the falling reset signal dn_rst are output from the reset pulse simulation circuit 2, the control circuit outputs a control signal instructing to turn on to the switch 11 and the switch 13, and outputs a control signal instructing to turn off to the other switches. The switches 11 and 13 are turned on when receiving the control signal instructing to turn on, and the other switches are turned off when receiving the control signal instructing to turn off. FIG. 11C illustrates charging of the capacitor 10 in the negative direction, and the capacitor 10 is charged with a charge in the negative direction in accordance with the second current output from the CP 5. Thus, in the capacitor 10, the charge charged in mode 2 is subtracted from the charge charged in mode 1, and the difference between the charges is charged (held) in the capacitor 10.

(Mode 3)

Figure 11D:
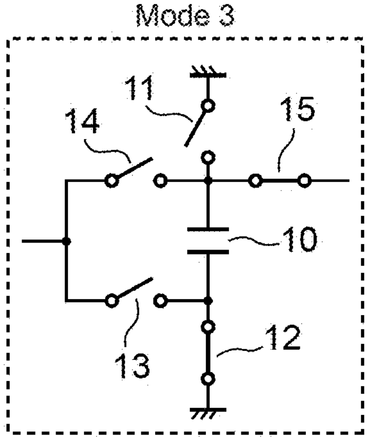

In mode 3, in the second switched capacitor circuit SC2, as illustrated in FIG. 11D, the switch 12 and the switch 15 are turned on, and the switch 11, the switch 13, and the switch 16 are turned off. The on/off of each switch is controlled by, for example, a control circuit (not illustrated).

For example, when the outputs of the signals from both the PFD 1 and the reset pulse simulation circuit 2 are not detected, the control circuit outputs a control signal instructing to turn on to the switch 12 and the switch 15, and outputs a control signal instructing to turn off to the other switches. The switches 12 and 15 are turned on when receiving the control signal instructing to turn on, and the other switches are turned off when receiving the control signal instructing to turn off. FIG. 11D illustrates an output of the current by the charge after the subtraction charged in the capacitor 10, and the current by the charge after the subtraction is output as the output current of the phase comparator.

As described above, in the third embodiment, the second switched capacitor circuit SC2 implements functions equivalent to the functions implemented by the first switched capacitor circuit SC1 (the first charge holding circuit 6 and the second charge holding circuit 7) and the subtraction circuit 8 in the first embodiment. In particular, in the second switched capacitor circuit SC2, since the charge subtraction can be implemented only by switches and capacitors which are passive elements, the possibility of generating additional noise at the time of subtraction is reduced as compared with the first embodiment.

Note that, in the above description, an example in which the second switched capacitor circuit SC2 is applied to the first embodiment has been described. However, the second switched capacitor circuit SC2 may be applied to the second embodiment.

As described above, according to the third embodiment, the current output circuit includes the second switched capacitor circuit SC2 to charge the capacitor 10 with a charge in the positive direction in accordance with the first current output from the charge pump circuit 5, charge the capacitor 10 with a charge in the negative direction in accordance with the second current output from the charge pump circuit 5, and output a current based on the charge after being charged in the negative direction. Thus, in addition to the effects of the first embodiment, the phase comparator according to the third embodiment is less likely to generate additional noise at the time of charge subtraction than the first embodiment.

Note that, in the present disclosure, free combinations of the individual embodiments, modifications of any components of the individual embodiments, or omissions of any components in the individual embodiments are possible.

INDUSTRIAL APPLICABILITY

The present disclosure can obtain an effect of suppressing phase noise in a low offset frequency region without impairing loop stability as compared with a conventional method, and is suitable for use in a phase comparator.

REFERENCE SIGNS LIST

1: phase frequency detector (PFD), 2: reset pulse simulation circuit, 3: OR circuit, 4: OR circuit, 5: charge pump circuit (CP), 6: first charge holding circuit, 7: second charge holding circuit, 8: subtraction circuit, 9: input selection circuit, 10: capacitor, 11 to 15: switch, 51 to 52: switch, 61 to 62: switch, 63: capacitor (first capacitor), 71 to 72: switch, 73: capacitor (second capacitor), Icp1: first current source, Icp2: second current source, SC1: first switched capacitor circuit, SC2: second switched capacitor circuit

The invention claimed is:

1. A phase comparator comprising:

a phase frequency comparator to compare phases of a reference clock signal and a feedback clock signal, and output a voltage rising signal and a voltage falling signal on a basis of a difference of the phases;

a reset pulse simulation circuit to output, every time the phase frequency comparator completes outputting of the voltage rising signal and the voltage falling signal, a rising reset signal and a falling reset signal, the rising reset signal having a pulse width corresponding to pulse width of the voltage rising signal and the falling reset signal having a pulse width corresponding to pulse width of the voltage falling signal output from the phase frequency comparator when a phase difference between the reference clock signal and the feedback clock signal is zero;

a charge pump circuit to output a first current on a basis of the voltage rising signal and the voltage falling signal output from the phase frequency comparator, and output a second current on a basis of the rising reset signal and the falling reset signal output from the reset pulse simulation circuit; and a current output circuit having a capacitor capable of being charged with a charge in accordance with the first current output from the charge pump circuit and a charge in accordance with the second current output from the charge pump circuit, the current output circuit being to output a current based on a difference between the charge in accordance with the first current and the charge in accordance with the second current that are charged in the capacitor.

2. The phase comparator according to claim 1, wherein the current output circuit includes a first capacitor and a second capacitor as the capacitor, a switched capacitor circuit to charge the first capacitor with a charge in accordance with a first current output from the charge pump circuit and charge the second capacitor with a charge in accordance with a second current output from the charge pump circuit, and a subtraction circuit to calculate a difference between the charge charged in the first capacitor and the charge charged in the second capacitor, and output a current based on the calculated difference.

3. The phase comparator according to claim 1, wherein the current output circuit includes a switched capacitor circuit to charge the capacitor with a charge in a positive direction in accordance with a first current output from the charge pump circuit, charge the capacitor with a charge in a negative direction in accordance with a second current output from the charge pump circuit, and output a current based on the charge after being charged in the negative direction.

4. A PLL circuit comprising:

the phase comparator according to claim 1;

a loop filter to generate and output a voltage on a basis of a current output from the phase comparator;

a voltage-controlled oscillator to generate and output an output clock signal having a frequency corresponding to the voltage output from the loop filter; and a variable frequency divider to frequency-divide the output clock signal output from the voltage-controlled oscillator and output a frequency-divided output clock signal to the phase frequency comparator as the feedback clock signal.

5. A phase comparator comprising:

an input selection circuit to alternately perform, with respect to inputs of a reference clock signal and a feedback clock signal, an output of a first signal pair including a signal rising in synchronization with a rising edge of the reference clock signal and a signal rising in synchronization with a rising edge of the feedback clock signal, or an output of a first signal pair including a signal falling in synchronization with a falling edge of the reference clock signal and a signal falling in synchronization with a falling edge of the feedback clock signal, and an output of a second signal pair including two signals having a same phase;

a phase frequency comparator to output a voltage rising signal and a voltage falling signal on a basis of a phase difference of signals included in the first signal pair output from the input selection circuit and a phase difference of signals included in the second signal pair output from the input selection circuit;

a charge pump circuit to output a first current on a basis of the voltage rising signal and the voltage falling signal output on a basis of a phase difference of signals included in the first signal pair, and output a second current on a basis of the voltage rising signal and the voltage falling signal output on a basis of a phase difference of signals included in the second signal pair, out of the voltage rising signal and the voltage falling signal output from the phase frequency comparator; and a current output circuit having a capacitor capable of being charged with a charge in accordance with the first current output from the charge pump circuit and a charge in accordance with the second current output from the charge pump circuit, the current output circuit being to output a current based on a difference between the charge in accordance with the first current and the charge in accordance with the second current that are charged in the capacitor.

6. The phase comparator according to claim 5, wherein the current output circuit includes a first capacitor and a second capacitor as the capacitor, a switched capacitor circuit to charge the first capacitor with a charge in accordance with a first current output from the charge pump circuit and charge the second capacitor with a charge in accordance with a second current output from the charge pump circuit, and a subtraction circuit to calculate a difference between the charge charged in the first capacitor and the charge charged in the second capacitor, and output a current based on the calculated difference.

7. The phase comparator according to claim 5, wherein the current output circuit includes a switched capacitor circuit to charge the capacitor with a charge in a positive direction in accordance with a first current output from the charge pump circuit, charge the capacitor with a charge in a negative direction in accordance with a second current output from the charge pump circuit, and output a current based on the charge after being charged in the negative direction.

8. A PLL circuit comprising:

the phase comparator according to claim 5;

a loop filter to generate and output a voltage on a basis of a current output from the phase comparator;

a voltage-controlled oscillator to generate and output an output clock signal having a frequency corresponding to the voltage output from the loop filter; and a variable frequency divider to frequency-divide the output clock signal output from the voltage-controlled oscillator and output a frequency-divided output clock signal to the phase frequency comparator as the feedback clock signal.

* * * * *